United States Patent
Nguyen et al.

[11] Patent Number: 5,939,334
[45] Date of Patent: Aug. 17, 1999

[54] SYSTEM AND METHOD OF SELECTIVELY CLEANING COPPER SUBSTRATE SURFACES, IN-SITU, TO REMOVE COPPER OXIDES

[75] Inventors: Tue Nguyen; Lawrence J. Charneski, both of Vancouver, Wash.; David R. Evans, Beaverton, Oreg.; Sheng Teng Hsu, Camas, Wash.

[73] Assignees: Sharp Laboratories of America, Inc., Camas, Wash.; Sharp Kabushiki Kaisha, Osaka, Japan

[21] Appl. No.: 08/861,808

[22] Filed: May 22, 1997

[51] Int. Cl.$^6$ .................................................. H01L 21/302
[52] U.S. Cl. .................... 438/689; 438/689; 438/629; 438/637; 438/638; 438/639; 438/640; 438/668; 438/672; 438/675; 438/677
[58] Field of Search .................................. 438/907, 629, 438/637–640, 668, 672, 675, 677, 689, 706, 709–711; 148/DIG. 17, DIG. 20

[56] References Cited

U.S. PATENT DOCUMENTS

| | | | |
|---|---|---|---|
| 5,424,246 | 6/1995 | Matsuo et al. | 438/642 |
| 5,650,015 | 7/1997 | Kobayashi | 134/2 |
| 5,686,151 | 11/1997 | Imai et al. | 427/576 |
| 5,705,443 | 1/1998 | Stauf et al. | 438/722 |
| 5,744,192 | 4/1998 | Nguyen et al. | 427/99 |
| 5,767,301 | 1/1997 | Senzaiki et al. | 556/9 |
| 5,789,027 | 11/1996 | Watkins et al. | 427/250 |
| 5,820,664 | 3/1995 | Gardiner et al. | 106/287.17 |
| 5,821,169 | 8/1996 | Nguyen et al. | 438/736 |
| 5,851,367 | 10/1996 | Nguyen et al. | 438/694 |

OTHER PUBLICATIONS

Paper titled, "Etching of Copper and Copper Oxide at High Rates via Generation of Volatile Copper Species" by Farkas, J., Chi, K.M., Hampden–Smith, M.J. and Kodas, T.T., presented at the European Spring 92 MRS, Jun. 1992.

*Primary Examiner*—Charles Bowers
*Assistant Examiner*—Thanh Nguyen
*Attorney, Agent, or Firm*—Gerald Maliszewski; David C. Ripma

[57] ABSTRACT

A system and method of selectively etching copper surfaces free of copper oxides in preparation for the deposition of an interconnecting metallic material is provided. The method removes metal oxides with β-diketones, such as Hhfac. The Hhfac is delivered into the system in vapor form, and reacts almost exclusively to copper oxides. The by-products of the cleaning process are likewise volatile for removal from the system with a vacuum pressure. Since the process is easily adaptable to most IC process systems, it can be conducted in an oxygen-free environment, without the removal of the IC from the process chamber. The in-situ cleaning process permits a minimum amount of copper oxide to reform before the deposition of the overlying interconnection metal. In this manner, a highly conductive electrical interconnection between the copper surface and the interconnecting metal material is formed. An IC having a metal interconnection, in which the underlying copper layer is cleaned of copper oxides, in-situ with Hhfac vapor, is also provided.

9 Claims, 5 Drawing Sheets

Hhfac VAPOR PRESSURE VS INVERSE TEMPERATURE

SYSTEM AND METHOD OF SELECTIVELY CLEANING COPPER SUBSTRATE SURFACES, IN-SITU, TO REMOVE COPPER OXIDES

BACKGROUND AND SUMMARY OF THE INVENTION

This invention relates generally to integrated circuit (IC) processes and fabrication, and more particularly, a system and method for cleaning copper oxides from a copper IC surface, in-situ, to improve electrical conductivity between the copper and subsequently deposited conductive materials.

The demand for progressively smaller, less expensive, and more powerful electronic products, in turn, fuels the need for smaller geometry integrated circuits, and large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different impedance characteristics.

There is a need for interconnects and vias to have both low resistivity, and the ability to withstand volatile process environments. Aluminum and tungsten metals are often used in the production of integrated circuits for making interconnections or vias between electrically active areas. These metals are popular because they are easy to use in a production environment, unlike copper which requires special handling.

Copper (Cu) is a natural choice to replace aluminum in the effort to reduce the size of lines and vias in an electrical circuit. The conductivity of copper is approximately twice that of aluminum and over three times that of tungsten. As a result, the same current can be carried through a copper line having half the width of an aluminum line.

The electromigration characteristics of copper are also much superior to those of aluminum. Aluminum is approximately ten times more susceptible than copper to degradation and breakage through electromigration. As a result, a copper line, even one having a much smaller cross-section than an aluminum line, is better able to maintain electrical integrity.

There have been problems associated with the use of copper, however, in IC processing. Copper contaminates many of the materials used in IC processes and, therefore, care must be taken to keep copper from migrating. Various means have been suggested to deal with the problem of copper diffusion into integrated circuit material. Several materials, particularly refractory metals, have been suggested for use as barriers to prevent the copper diffusion process. Tungsten, molybdenum, and titanium nitride (TiN) are examples of refractory metals which may be suitable for use as copper diffusion barriers. However, the adhesion of copper to these diffusion barrier materials has been an IC process problem, and the electrical conductivity of such materials is an issue in building IC interconnects.

Metal cannot be deposited onto substrates, or into vias, using conventional metal deposition processes, such as sputtering, when the geometries of the selected IC features are small. It is impractical to sputter metal, either aluminum or copper, to fill small diameter vias, since the gap filling capability is poor. To deposit copper, various chemical vapor deposition (CVD) techniques are under development in the industry.

In a typical CVD process, copper is combined with an organic ligand to make a volatile copper compound or precursor. That is, copper is incorporated into a compound that is easily vaporized into a gas. Selected surfaces of an integrated circuit, such as diffusion barrier material, are exposed to the copper containing gas in an elevated temperature environment. When the volatile copper gas compound decomposes, copper is left behind on the heated selected surface. Several copper compounds are available for use with the CVD process. It is generally accepted that the molecular structure of the copper compound, at least partially, affects the conductivity of the copper film residue on the selected surface.

Connections between metal levels, such as copper, which are separated by dielectric interlevels, are typically formed with a damascene method of via formation between metal levels. The underlying copper film is first completely covered with the dielectric, a typical dielectric is silicon dioxide. A patterned photoresist profile is then formed over the dielectric. The resist profile has an opening, or hole, in the photoresist corresponding to the area in the dielectric where the via is to be formed. Other areas of the dielectric to be left in place are covered with photoresist. The dielectric not covered with photoresist is then etched to remove oxide underlying the hole in the photoresist. The photoresist is then stripped away. A thin film of copper, or some other metallic material, is then used to fill the via. A layer consisting of dielectric with a copper via through it now overlies the copper film. The excess copper remaining is removed with a chemical mechanical polish (CMP) process, as is well known in the art. The result is an "inlaid" or damascene structure.

The deposition of copper using a CVD process often involves the deposition of by-products on the copper surface. The copper is combined with ligands in the CVD precursor until deposition. As the copper decomposes from the precursor, ligands, or parts of ligands, may decompose in solid form, or combine with other materials in the environment, to degrade the copper film. In addition, the copper film is exposed to other IC material and etching processes which cover the film with by-products. These by-products must be removed to make a good electrical contact with subsequently deposited metal layers. As a result, these copper films must be cleaned to improve electrical conductivity, before they can be interfaced with metallic contacts in the IC.

A co-pending application, Ser. No. 08/717,267, filed Sep. 20, 1996, entitled, "Oxidized Diffusion Barrier Surface for the Adherence of Copper and Method for Same", invented by Tue Nguyen, Lawrence J. Charneski, and Lynn R. Allen, Attorney Docket No. SMT 123, which is assigned to the same Assignees as the instant patent, discloses a method for oxidizing the diffusion barrier surface to improve the adherence of copper to a diffusion barrier. In low speed electrical circuits the resistance offered by a thin level of oxide is unnoticeable. However, in higher speed applications even a small amount of resistance can increase the propagation delay of electron current across an oxide layer. The primary purpose of this, above mentioned, patent application is to improve the ability of copper to remain deposited on a surface, not on improving the conductivity between copper and another surface.

Another co-pending application, Ser. No. 08/717,315, filed Sep. 20, 1996, entitled, "Copper Adhered to a Diffusion Barrier Surface and Method for Same", invented by Lawrence J. Charneski and Tue Nguyen, Attorney Docket No. SMT 243, which is assigned to the same Assignees as the instant patent, discloses a method for using a variety of reactive gas species to improve copper adhesion without forming an oxide layer over the diffusion barrier. However, the focus of this patent is to improve copper adhesion, not to improve the conductivity of copper deposited on a surface. In addition, the method of the above patent is generally only applicable to diffusion barrier material.

Another co-pending application, Ser. No. 08/739,567, filed Oct. 11, 1996, entitled, "Chemical Vapor Deposition of Copper on an ION Prepared Conductive Surface and Method for Same," invented by Nguyen and Maa, Attorney Docket No. 114, which is assigned to the same Assignees as the instant patent, discloses a method of preparing a conductive surface, such as copper, with an exposure to the ions of an inert gas to improve electrical conductivity between a conductive surface and a subsequent deposition of copper. However, the primary purpose of this invention is to prepare a conductive surface that is substantially free of by-products and IC process debris.

It would be advantageous to employ a method of cleaning a copper IC substrate surface while minimally exposing the surface to oxygen, to suppress the formation of copper oxides on the surface.

It would be advantageous to employ a method of cleaning an IC substrate to selectively remove only copper oxides from a copper conductive surface, minimizing the removal of copper from the copper conductive surface.

It would be advantageous if a selective copper cleaning process used the vapor of a room temperature liquid which could be easily delivered into an IC process system to volatilize copper oxides. In this manner, the IC would not have to be removed from the chamber for cleaning and exposure to an oxygen atmosphere.

Accordingly, in an integrated circuit having a dielectric interlevel with a dielectric surface, and a plurality of metal levels underlying the dielectric interlevel, a method for selectively cleaning metal oxides, in-situ, from a surface on a first metal level, accessed through a via from the dielectric surface, is provided. The method comprises the steps of:

a) providing an atmosphere surrounding the integrated circuit;

b) controlling the atmosphere to be substantially free of oxygen, whereby the formation of metal oxides on the first metal level surface is minimized;

c) introducing a β-diketone vapor into the atmosphere; and d) volatilizing the metal oxidizes from the first metal level surface using the β-diketone vapor introduced in step c). A minimal amount of material is removed from the first metal level surface in preparation for an electrical connection with subsequently deposited metal levels.

Typically, the first metal level surface is a metal selected from the group consisting of copper and silver. In one aspect of the invention, step c) includes using hexafluoroacetylacetonate (Hhfac) as the β-diketone to volatilize the oxides on the conductive interlevel connection surface.

In another aspect of the invention step c) includes delivering the Hhfac at a pressure of less than approximately 85 Torr and a temperature of approximately 20° C. The method typically includes the further step, following step d), of creating a vacuum to remove the volatile metal oxides obtained in step d) from the atmosphere. The volatile cleaning by-products are easily removed from the area of the IC by creating a vacuum.

Another aspect of the invention includes the further step, before step c), of controlling the IC temperature to be in the range between 100° C. and 450° C. The method includes the further step, following step d), of, while maintaining the atmosphere established in step b), depositing a second metal level overlying the first metal level surface to electrically interface to the first metal level. A cleaning process facilitates a low resistance electrical connection. The second metal level is a metal selected from the group consisting of TiN, $TiSi_xN_y$, $TaSi_xN_y$, TaN, WN, $WSi_xN_y$, Ti, Ta, W, Cu, Al, Ag, and Au.

An integrated circuit is also provided comprising a dielectric interlevel with a dielectric surface, and a plurality of metal levels underlying the dielectric interlevel. The integrated circuit further comprises a via from the dielectric surface to a first metal level, and a surface on the first interlevel. The first metal level surface is accessed from the dielectric surface through the via. The first metal level surface is prepared for subsequent overlying metal depositions with a process for the selective, in-situ, cleaning the first metal level surface of metal oxides with a β-diketone vapor, in an atmosphere free of oxygen. The metal oxides are removed with a minimal loss of the first metal level surface.

In an integrated circuit, including a dielectric interlevel with a dielectric surface, and a plurality of metal levels underlying the dielectric interlevel, a system for the selective, in-situ, cleaning of metal oxides from a surface on a first metal level, accessed through a via from the dielectric surface to the first metal level, is provided. The system comprises a chamber to control an atmosphere to be substantially free of oxygen, whereby the formation of metal oxides on the first metal level surface is minimized. The system also comprises a bubbler to introduce a β-diketone vapor into the chamber, and a wafer chuck located inside the chamber and upon which the IC is mounted. The wafer chuck has a predetermined temperature to control the temperature of the IC, whereby the β-diketone volatilizes metal oxides on the surface of the first metal, in preparation for electrical connection to subsequently deposited metal levels.

BRIEF DESCRIPTIONS OF THE DRAWINGS

DETAIL DESCRIPTION OF THE PREFERRED EMBODIMENT

Figure 1:
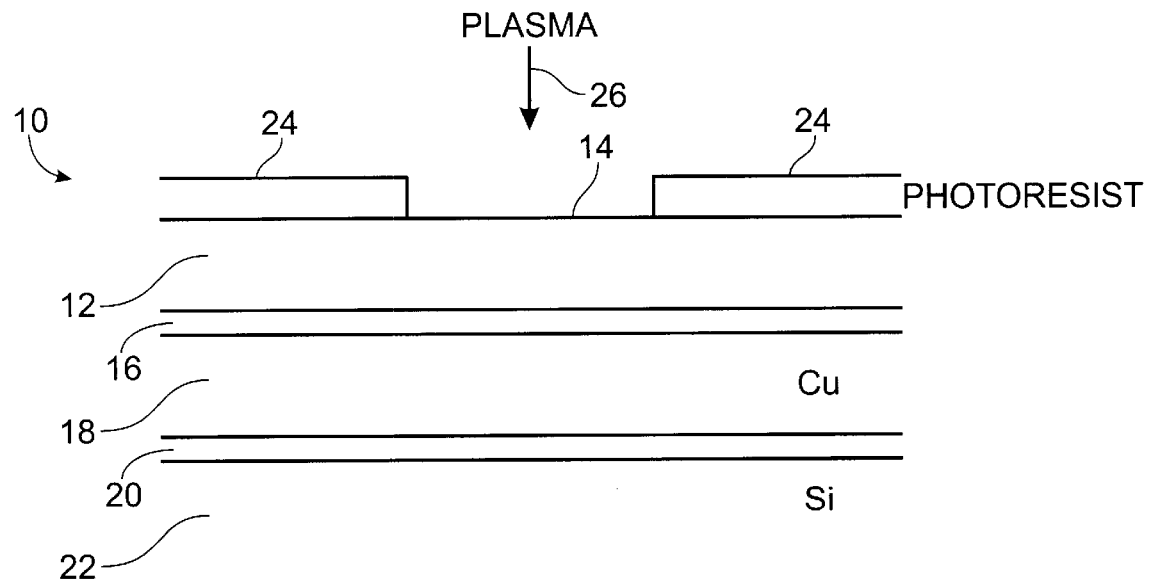
FIGS. 1 through 4 illustrate steps in the formation of an IC with a first metal level surface, prepared for a subsequent deposition of a second metal level, with a process for the selective, in-situ, cleaning of the first metal level surface of metal oxides.

FIGS. 1 through 4 illustrate steps in the formation of an IC with a first metal level surface, prepared for a subsequent deposition of a second metal level, with a process for the selective, in-situ, cleaning of the first metal level surface of metal oxides. The metal oxides are cleaned with a β-diketone vapor in an atmosphere free of oxygen. FIG. 1 is a cross-sectional view of an IC 10. IC 10 consists of a dielectric interlevel 12 with a dielectric surface 14, and a plurality of metal levels underlying dielectric interlevel 12. Dielectric interlevel 14 is typically an electrical insulator such as an oxide or nitride of silicon, fluorinated carbon, or parylene (F or N). Underlying dielectric interlevel 12 is a barrier insulator layer 16, and underlying barrier insulator layer 16 is a first metal level 18. First metal level 18 is a metal selected from the group consisting of copper and silver. Underlying first metal level 18 is a barrier metal layer 20, and underlying barrier metal layer 20 is a layer of silicon 22.

A number of materials may be used in the dielectric interlevels and barrier levels of IC 10, the materials chosen in FIG. 1, and the arrangement of the materials, are typical, but not exclusive, of those used in IC processes with first metal level 18. Barrier layers 16 and 20 are not required to enable the invention, but are included when it is important to prevent the migration of metal atoms from first metal level 18 to other sensitive IC circuit materials (not shown). IC 10 usually includes a variety of coupled electrical components such as transistors, capacitors, and resistors. Further, IC 10 includes assemblies of the above mentioned parts to create logic networks and integrated circuits.

FIG. 1 is the first step in a damascene process of forming a metallic electrical interconnection to first metal level 18. That is, a via is to be formed from dielectric surface 14 to first metal level 18. One method of forming the via is to cover dielectric surface 14 with photoresist 24. Photoresist 24 is patterned so that a gap appears in the photoresist to expose dielectric surface 14. The via is to be formed in the area where dielectric surface 14 is exposed.

After the photoresist has been deposited and patterned to form an opening, IC 10 is etched to remove material from dielectric interlevel 12 below exposed dielectric surface 14. As is well known in the art, a fluorine, oxygen, or ozone plasma is typically used in the etching process.

Figure 2:
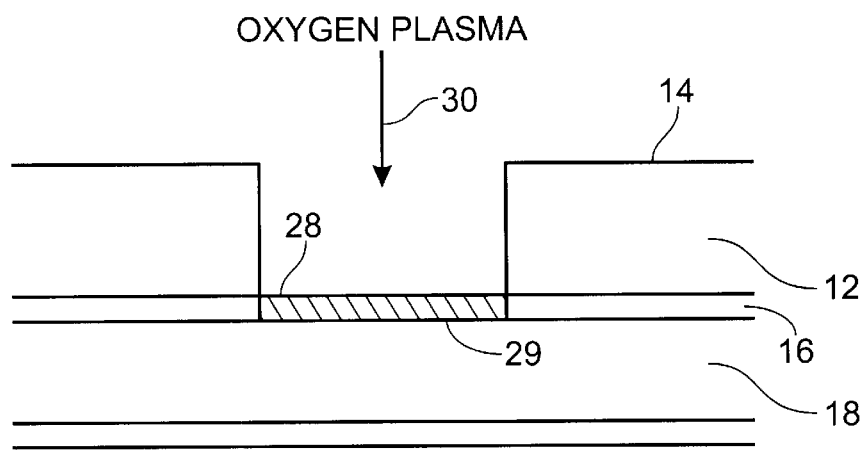

FIG. 2 is a cross-sectional view of IC 10 following the plasma etch step. Photoresist 24 has also been stripped away. As a result of the plasma etch performed in FIG. 1, various by-products and polymers 18 are formed on a first metal level surface 29 on first metal level 28, which is accessed from dielectric surface 14 through a via. By-products 28, formed as a result of etching dielectric interlevel 12 are often difficult to remove. A process operation referred to as ashing is often used to remove by-products 28. An oxygen or ozone plasma 30 isotropically etches by-products 28 from the via. In many processes, photoresist 24 (FIG. 1) and polymer by-products 28 are removed in the same step.

Figure 3:
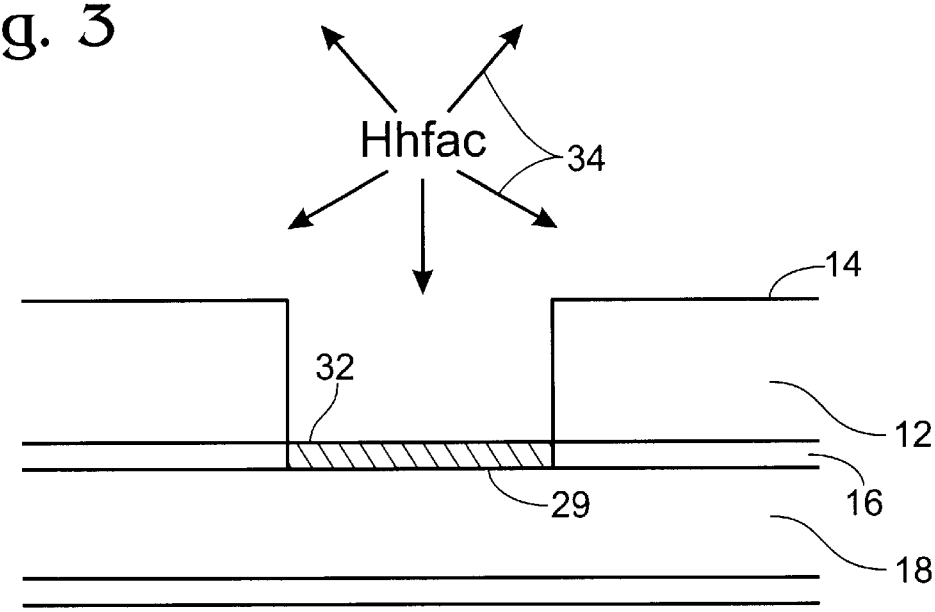

FIG. 3 is a cross-sectional view of IC 10 following the process of ashing. Since the ashing operation involves the use of oxygen, metal oxides 32 are formed overlying first metal level surface 29. To remove metal oxide layer 32, a β-diketone vapor 34, such as Hhfac, is introduced. For example, when first metal level 18 is copper, Hhfac reacts with copper oxide to form water and the volatile $Cu^{+2}(hfac)_2$ complex. Since water is also volatile, CuO 32 is entirely removed from first metal level surface 29 in a vapor phase as shown below:

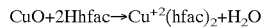

$CuO+2Hhfac \rightarrow Cu^{+2}(hfac)_2+H_2O$

A more complete discussion of β-diketones is presented with regard to FIG. 5, below.

β-diketone vapor 34 removes metal oxides 32 with a minimal loss of first metal level surface 29. To better appreciate the action of β-diketone vapor 34, a brief comparison is made to the cleaning action of fluorine and oxygen plasmas 26 and 30, below.

Fluorine and oxygen plasma etchants, 26 and 30, depicted in FIGS. 1 and 2 are anisotropic and relatively non-selective. That is, plasmas 26 and 30 are directional, removing intended target materials, and a portion of unintended target materials. IC 10 and a wafer chuck upon which IC 10 is mounted (not shown), must be suitably positioned in an ionized environment to direct the plasmas to intended targets. In FIG. 1, plasma 26 is directed perpendicular to dielectric surface 14 to form a via with minimum undercutting beneath photoresist layers 24. In FIG. 2, oxygen plasma 30 is directed to remove polymer layer 28 in the bottom of the via hole. Metal oxide layer 32 is likewise located in the bottom of the via. Care must be taken to protect sensitive surfaces that are not to be removed in the etching process.

Even though the β-diketone vapor is ubiquitous throughout the atmosphere in which IC 10 is placed, it works selectively to remove only metal oxide layer 32. In one aspect of the invention the β-diketone is Hhfac. The cleaning by-products formed from the reaction of Hhfac with oxides of copper and silver are volatile. These volatile by-products are easily removed from first metal level surface 29 with a minimal loss of first metal level surface 29, and the area of IC 10 without breaking the chamber vacuum prior to the deposition of a subsequent metal layer.

Figure 4:
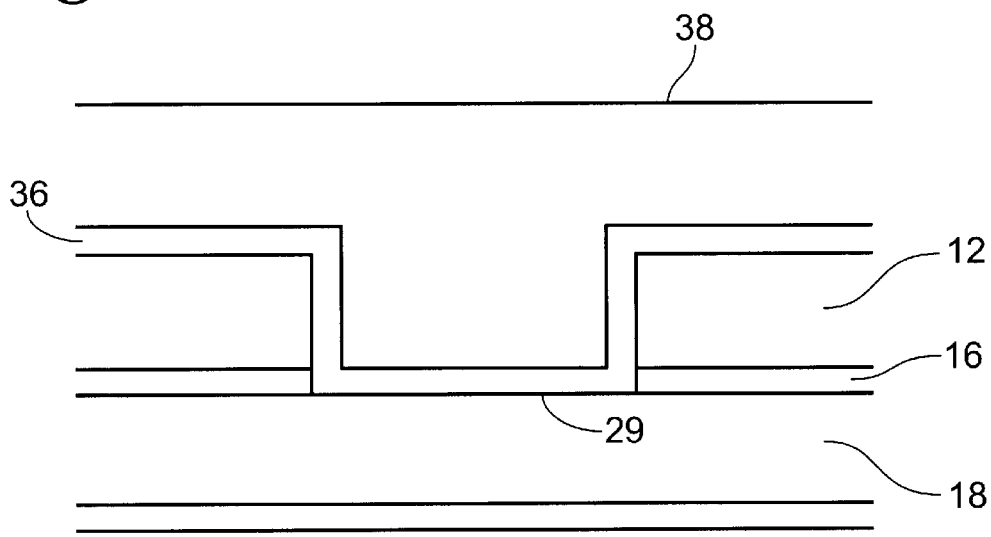

FIG. 4 is a cross-sectional view of IC 10 following the process for the selective, in-situ, deaning of first metal level surface 29 of metal oxides 32 with β-diketone vapor 34 in an atmosphere free of oxygen, as shown in FIG. 3. First metal level surface 29 has not had an opportunity to form another layer of metal oxide, and is prepared for the subsequent deposition of a metal level. A second metal layer 36 overlies first metal level surface 29 in the via, and dielectric surface 14. Second metal layer 36 is deposited on first metal level surface 29, after the in-situ deaning process shown in FIG. 3, to electrically communicate with first metal level 18. The in-situ deaning process helps insure that a low resistance electrical interconnect, or interface, results between the two metal structures. Metal layer 36 is selected from the group of metals consisting of TiN, $TiSi_xN_y$, $TaSi_xN_y$, TaN, WN, $WSi_xN_y$, Ti, Ta, W, Cu, Al, Ag, and Au. Typically, second metal layer 36 is a barrier metal layer, such as barrier metal layer 20. It is used to prevent the migration of metal atoms from first metal level 18 into underlying semiconductor material (not shown). Second metal level 36 is conductive to electrically interface with a third metal level 38 deposited over second metal level 36. When it is not important to prevent the migration of metal atoms from first metal level 18, third metal level 38 is deposited on first metal level 18 without the barrier layer, second metal level 36. Further, even when a barrier layer is used, it is standard practice in the industry to identify second metal level 36 as the combination of second metal level 36 and third metal level 38 depicted in FIG. 4. Second metal layer 36 and third metal layer 38 have been introduced, above, as separate metal layers for the purposes of clarity, however, from this point on the second metal layer is understood to be the combination of layers 36 and 38.

The relatively simple process of releasing an Hhfac vapor 34 to volatize metal oxide layer 32, and removing the volatilized by-products with a vacuum, is a large improvement in the method of cleaning metal oxides. Typically, no attempt is even made to dean copper surfaces of oxides. Exposure to the copper surface to an uncontrolled atmosphere, as it is moved between chambers after cleaning, causes the formation of more oxides on the surface. As a result, the electrical conductivity of copper surfaces in IC structures are often degraded. By keeping IC 10 in the oxygen-free environment, first metal level surface 29 is not allowed to re-oxidize after cleaning and the electrical connection to second metal level 36 is improved. Further, since Hhfac vapor 34 selectively removes only metal oxides 32 from first metal level surface 29, a minimum of conductive material is removed from first metal level 18. This is an important consideration in IC fabrication, in many designs the first metal level is less than 0.5 microns thick.

Hexafluoroacetylacetone or hfac is a particular example of a β-diketone. The prototypical example is the well known compound, acetylacetone or acac. This family of compounds is characterized by a molecular structure involving two carbonyl functional groups separated by a single carbon atom to which is attached at least one hydrogen atom. Hence, β-diketones are also characterized by keto-enol tautomerisms in which the enol form is stabilized by conjugated double bonds. This results in β-diketones having chemical properties of both ketones and enols. In addition, the conjugated nature of the double bonding implies significant delocalization of π-electrons. These delocalized electrons readily interact with the d-electrons of metal atoms to form coordination compounds. In such compounds, due to the presence of the two carbonyl groups, each β-diketone ligand coordinates twice with the metal atom to form a closed ring or chelated structure. Furthermore, the hydrogen atom involved in the ketoenol tautomerism is weakly bonded and, thus possesses significant acidic character. Thus, β-diketones readily form stable anions which can be combined with metallic cations to form stable complexes. The copper precursor (tmvs)(hfac)Cu(I) is an example of such a complex, however, many other types of these compounds exist and can be used for MOCVD. The choice of a specific β-diketone as ligand in a MOCVD precursor is determined by the desirable characteristics of the resulting complex. Typically, such properties are thermal stability, high volatility, etc. Generally, it is found that hfac possesses such desirable properties, however, research continues into developing other β-diketones having even more desirable characteristics than hfac.

Figure 5:
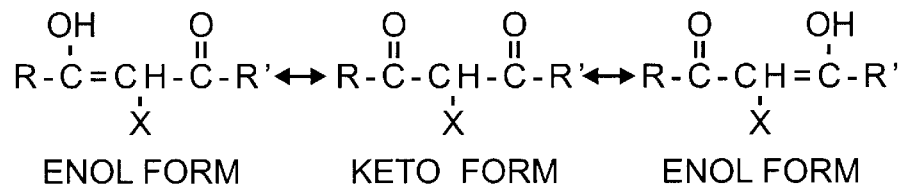
FIG. 5 is a representation of the keto-enol tautomerisms.

FIG. 5 is a representation of the keto-enol tautomerisms. A compound such as a β-diketone exists in both keto and enol forms. That is, the β-diketone exists in all three forms, although is generally true that keto-acids are more stable. There is no preference between the right-most and left-most enol forms. The O and OH groups are not predisposed in their carbon bonding to favor the formation of either enol form. Also in the structural formula of FIG. 5 are bonds to R, $R^1$, and X. The R and $R^1$ groups are selected from the set of groups consisting of C1 to C6 alkyls, perfluoroalkyls, and other substitutions which bond to the carbon atoms. The R and $R^1$ groups need not be the same. The number after the "C" refers to the number of carbon atoms in the alkyl group, for example, a C1 alkyl group contains 1 carbon atom. The X group is selected from the functional group consisting of H, F, CL, Br, I, alkyls, perfluoroalkyls, and substitutions which bond to the CH molecule. In Hhfac, for example, the R and $R^1$ groups are both $F_3$, and the X functional group is H.

Figure 6:
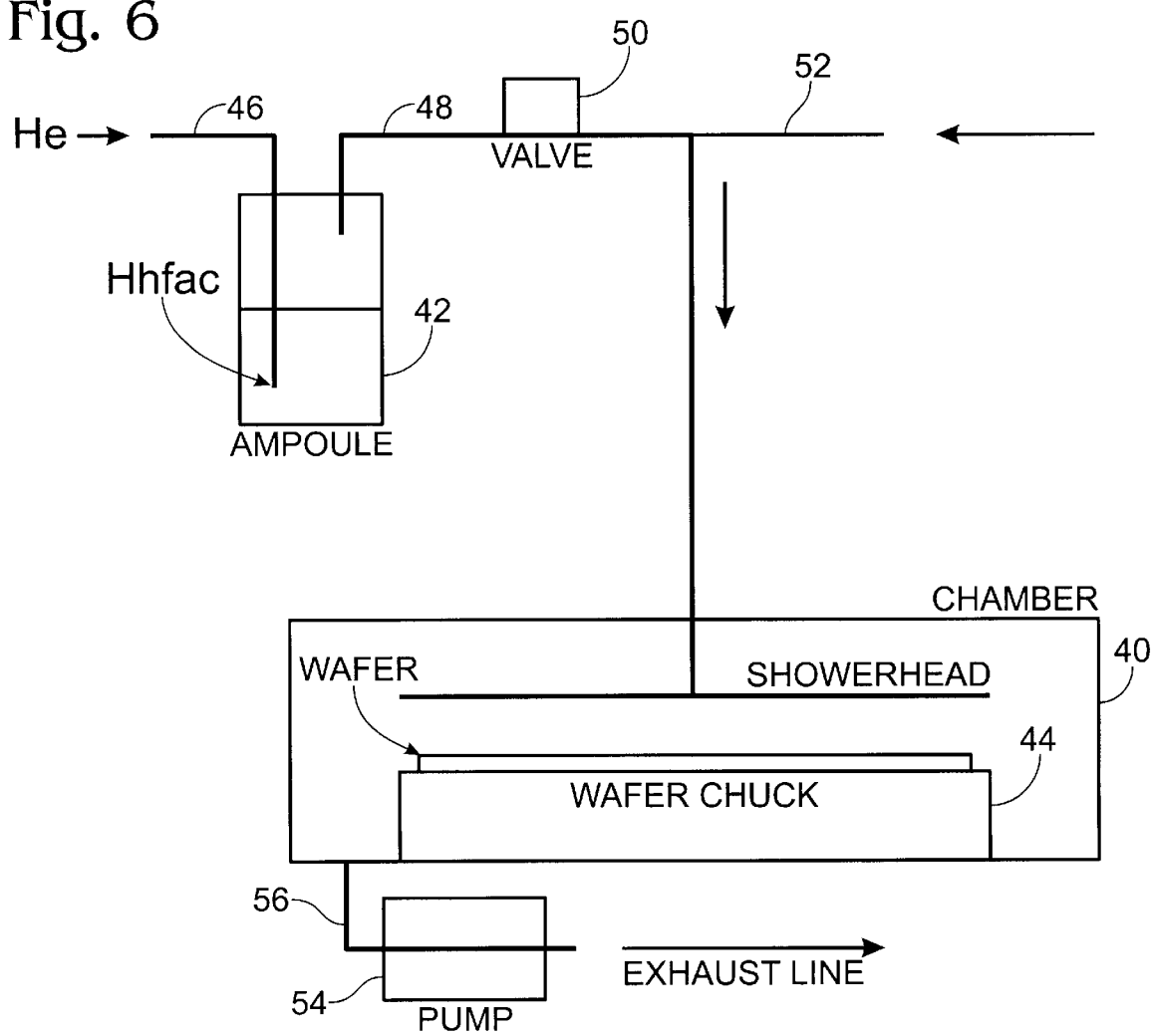
FIG. 6 illustrates a system for the selective, in-situ, cleaning of metal oxides from a surface on a first metal level of an integrated circuit.

FIG. 6 illustrates a system for the selective, in-situ, cleaning of metal oxides from a surface on a first metal level of an integrated circuit. The IC includes a dielectric interlevel with a dielectric surface, and a plurality of metal levels underlying the dielectric interlevel. The first metal level surface is accessed through a via from the dielectric surface to the first metal level. The system comprises a chamber 40 to control an atmosphere to be substantially free of oxygen during the cleaning and metal deposition process. The formation of metal oxides on the first metal level surface is, thus, minimized. In one aspect of the invention, chamber 40 is a cluster tool, or series of connected chambers sharing the same atmosphere. The system also comprises a bubbler 42 to introduce, or deliver, a β-diketone vapor into chamber 40. The system comprises a wafer chuck 44 located inside chamber 40, upon which the IC is mounted. Wafer chuck 44 has a predetermined temperature to control, or maintain, the temperature of the IC. The β-diketone volatilizes metal oxides on the surface of the first metal level in preparation for an electrical connection to subsequently deposited metal levels. FIGS. 1–4 correspond to steps in the process of forming an interconnection in an IC that are carried out in a system such as the one depicted in FIG. 6. As in first metal level 18 of FIGS. 1–4, the first metal level of the IC prepared in the above system is a metal selected from the group consisting of copper and silver.

In one aspect of the invention the β-diketone vapor introduced by bubbler 42 is Hhfac, whereby metal oxides from the first metal level surface are volatilized for easy removal from chamber 40. Bubbler 42 delivers the Hhfac at a pressure of less than approximately 85 Torr at a temperature of approximately 20° C. It is the relative ease to which Hhfac is introduced to chamber 40 that gives the present invention much of its value.

Bubbler 42 is a sealed ampule containing a β-diketone liquid such as Hhfac. The ampule is equipped with a gas inlet tube. The tube is inserted to below the surface of a liquid. A vapor output tube 48 is located at the top of bubbler 42 to draw away the Hhfac vapor. A carrier gas, typically an inert gas such as He, is forced into inlet 46 at a predetermined flow rate and bubbled through the Hhfac. The carrier gas becomes saturated with the Hhfac vapor. The partial pressure of the Hhfac vapor in the carrier gas is determined, or controlled, by the temperature of the liquid.

Figure 7:
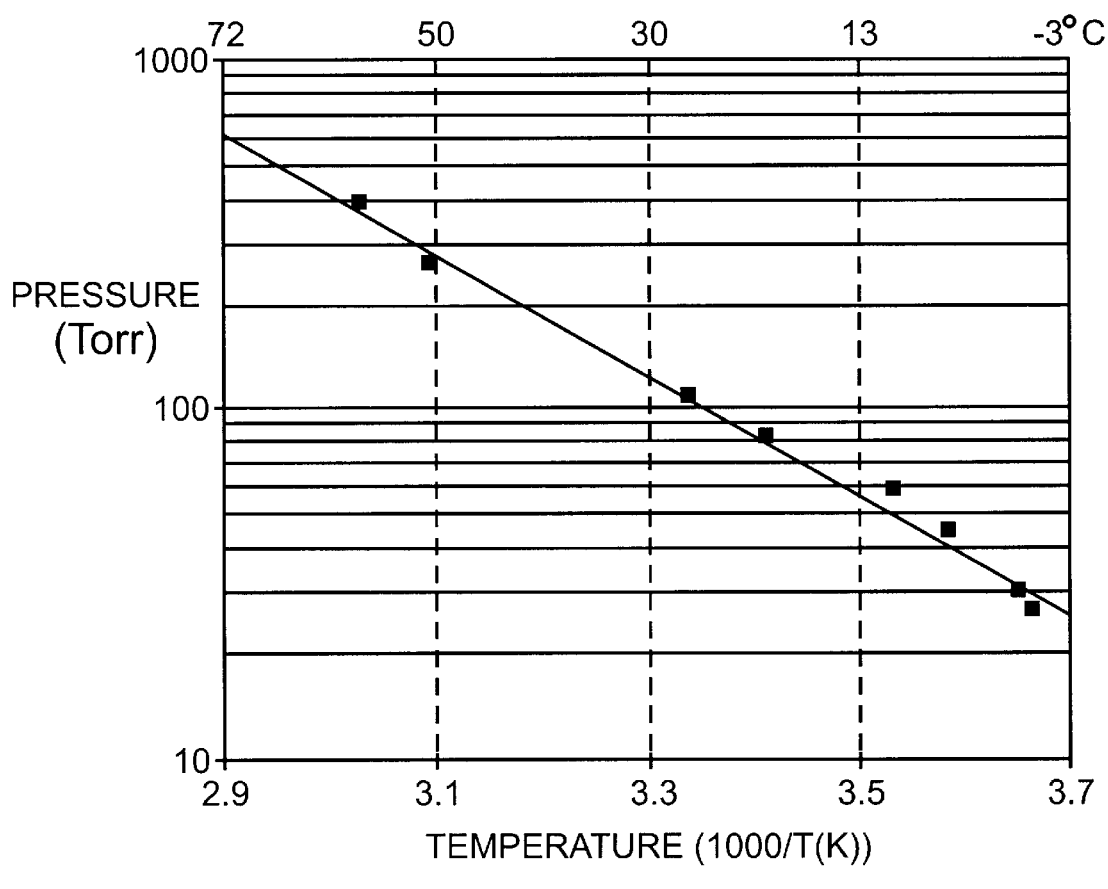
FIG. 7 is a graph illustrating the relationship of Hhfac vapor pressure versus inverse temperature.

FIG. 7 is a graph illustrating the relationship of Hhfac vapor pressure versus inverse temperature. As shown in the graph, at room temperature (20° C.) the corresponding Hhfac vapor pressure is approximately 85Torr. This relationship shows that high vapor pressures can be achieved with no special preparation of the Hhfac liquid. Referring again to FIG. 6, a valve, mass flow controller (MFC), or orifice arrangement 50 located between bubbler 42 and chamber 40, is sufficient to control the amount of Hhfac that enters chamber 40.

It is an aspect of the invention that wafer chuck 44 has a temperature is the range between 100 and 500° C. In this manner, the temperature of the IC is maintained in the range between 100 and 450° C. during the cleaning and metal layer deposition processes.

The system further comprises a liquid injector 52 to introduce liquid precursor compounds including metal into chamber 40. A second metal level is deposited on the first metal level surface, which is free of metal oxides, to facilitate a low resistance electrical connection. That is, after the process of cleaning metal oxides with the Hhfac, a liquid precursor is injected in line 52 to deposit the second metal level. Both the cleaning and the metal deposition processes are conducted in the oxygen-free environment of chamber 40, so that a minimum number of metal oxides are formed between steps. It is an aspect of the invention that the second metal level overlying the first metal level surface is a metal selected from the group consisting of TiN, $TiSi_xN_y$, $TaSi_xN_y$, TaN, WN, $WSi_xN_y$, Ti, Ta, W, Cu, Al, Ag, and Au.

In another embodiment of the invention, a vapor delivery system introduces vapor precursor compounds including metal on line 52 into chamber 40. A second metal level is deposited on the first metal level surface, which is free of oxides, to facilitate a low resistance electrical interconnection. The second metal level overlying the first metal level surface is a metal selected from the group consisting of TiN, $TiSi_xN_y$, $TaSi_xN_y$, TaN, WN, $WSi_xN_y$, Ti, Ta, W, Cu, Al, Ag, and Au.

This system also comprises a pump 54 to create a vacuum pressure in chamber 40. The volatile metal oxides of the first metal level surface are removed from chamber 40 through a line 56.

Figure 8:
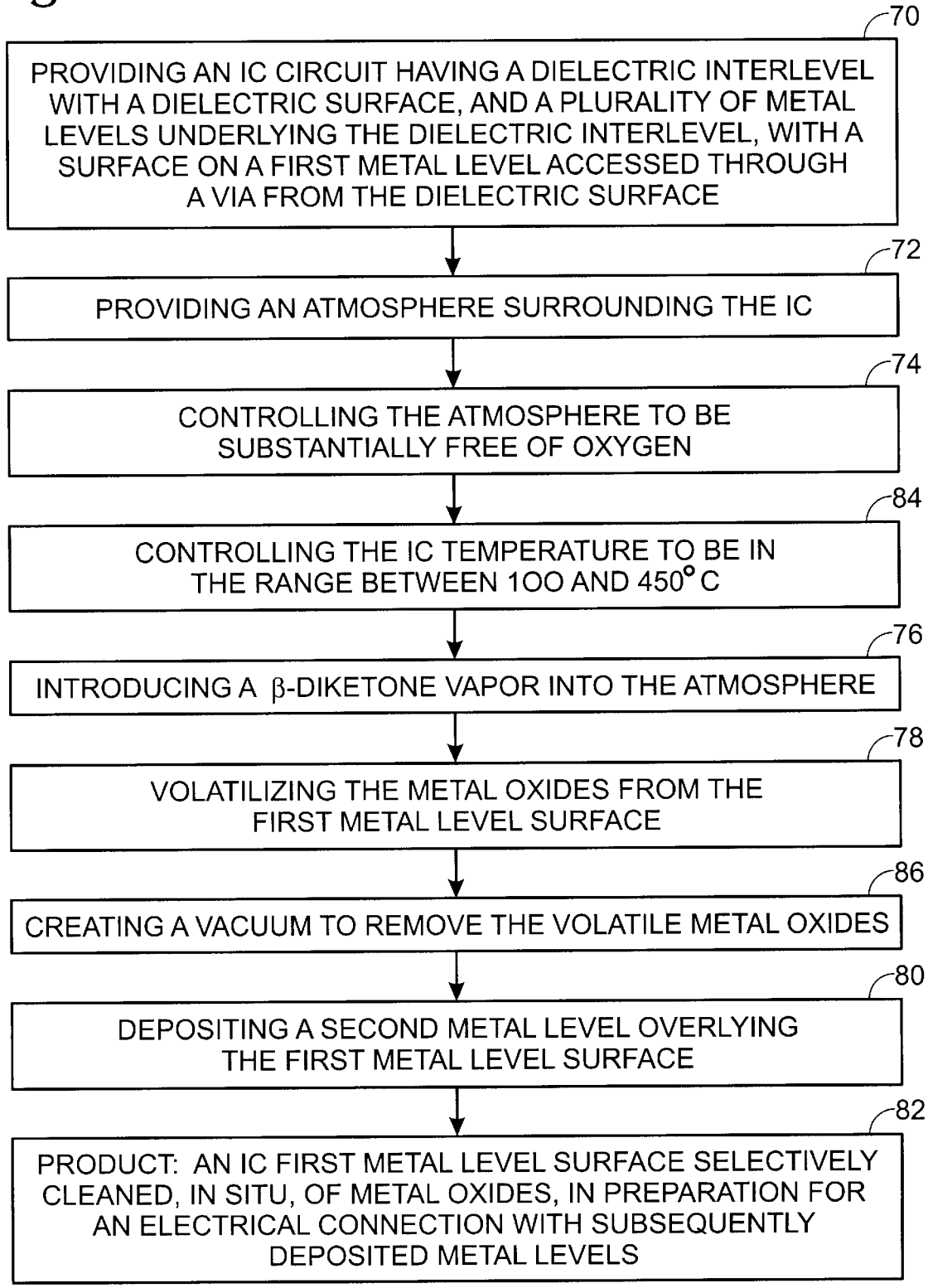
FIG. 8 is a flow chart illustrating steps in a method for selectively cleaning metal oxides, in-situ, from a surface on a first metal level.

FIG. 8 is a flow chart illustrating steps in a method for selectively cleaning metal oxides, in-situ, from a surface on a first metal level. Step 70 provides an IC circuit having a dielectric interlevel with a dielectric surface, and a plurality of metal levels underlying the dielectric interlevel. A surface on a first metal level is accessed through a via from the dielectric surface. Step 72 provides an atmosphere surrounding the IC. Step 74 controls the atmosphere to be substantially free of oxygen, whereby the formation of metal oxides on the first metal level surface is minimized. Step 76 introduces a β-diketone vapor into the atmosphere. Step 78 volatilizes the metal oxides from the first metal level surface using the β-diketone vapor introduced in step 76. While maintaining the atmosphere established in step 74, step 80 deposits a second metal level overlying the first metal level surface to electrically interface to the first metal level surface, whereby the cleaning process facilitates a low resistance electrical connection. The second metal level is a metal selected from the group consisting of TiN, TiSi$_x$N$_y$, TaSi$_x$N$_y$, TaN, WN, WSi$_x$N$_y$, Ti, Ta, W, Cu, Al, Ag, and Au. Step 82 is a product, a multilevel interconnected integrated circuit having a first metal level surface selectively cleaned, in-situ, of metal oxides with a minimal amount of material removed from the first metal level surface. The first metal level surface is cleaned in preparation for an electrical connection with subsequently deposited metal levels.

It is an aspect of the invention that the first metal level is a metal selected from the group consisting of copper and silver. It is another aspect, that step 76 includes using Hhfac as the β-diketone to volatilize oxides on the conductive interlevel connection surface. Further, step 76 includes delivering the Hhfac at a pressure of less than approximately 85 Torr and a temperature of approximately 20° C.

One aspect of the invention includes the further step 84, before step 76, of controlling the IC temperature to be in the range between 100 and 450° C. Another aspect of the invention includes the further step 86, following step 78, of, creating a vacuum to remove the volatile metal oxides obtained in step 78 from the atmosphere, whereby the cleaning by-products are easily removed from the area of the IC.

The IC, method, and system described above have focused, for the purpose of greater clarity, on preparing a first metal layer to interconnect with a second, subsequently deposited, metal layer. It is typical to fabricate ICs with a large number of metal layers. Interconnections must be made to all these metal layers. It is understood that the Hhfac cleaning and metal deposition process is not limited to an IC having only two metal levels. The above described process is repeated for each metal level in an IC so that interconnections are made to every metal level in an IC having a large number of metal levels.

The advantage of the present invention system of cleaning is that it is both simple and effective. The delivery system and preparation of the Hhfac is straightforward so it can be easily integrated into almost any IC process. This integration allows the cleaning to be conducted in-situ so that the IC is not exposed to oxygen prior to the deposition of the next metal layer. The above method simplifies the cleaning process because it is selective in reacting with only the oxides of copper or silver. Further, the cleaning by-products are volatile, and easily removed from the IC environment. Subsequently deposited metal layers can be deposited from systems using either liquid or vapor precursors. Other variations and embodiments of the invention will occur to those skilled in the art.

What is claimed is:

1. In an integrated circuit (IC) having a dielectric interlevel with a dielectric surface, and a plurality of metal levels underlying the dielectric interlevel, a method for selectively cleaning metal oxides, in-situ, from a surface on a first metal level, accessed through a via from the dielectric surface, the method comprising the steps of:

a) providing an atmosphere surrounding the integrated circuit;

b) controlling the atmosphere to be substantially free of oxygen, whereby the formation of metal oxides on the first metal level surface is minimized;

c) introducing a β-diketone vapor into the atmosphere; and d) volatilizing the metal oxides from the first metal level surface using the β-diketone vapor introduced in step c), whereby a minimal amount of material is removed from the first metal level surface in preparation for an electrical connection with subsequently deposited metal levels.

2. A method as in claim 1 wherein the first metal level is a metal selected from the group consisting of copper and silver.

3. A method as in claim 1 in which step c) includes using a β-diketone having the following structural formula:

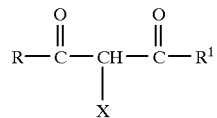

in which the R and R$^1$ groups are selected from the set of groups consisting of C1 to C6 alkyls, perfluoroalkyls, and other substitutions, and the X group is selected from the functional groups consisting of H, F, CL, Br, I, alkyls, perfluoroalkyls, and substitutions.

4. A method as in claim 3 in which step c) includes using hexafluoroacetylacetonate (Hifac) as the β-diketone to volatilize the metal oxides on the first metal level surface.

5. A method as in claim 4 in which step c) includes delivering the Hhfac at a pressure of less than approximately 85 Torr and a temperature of approximately 20° C.

6. A method as in claim 1 including the further step, following step d), of:

e) creating a vacuum to remove the volatile metal oxides obtained in step d) from the atmosphere, whereby the cleaning by-products are easily removed from the area of the IC.

7. A method as in claim 1 including the further step, before step c), of:

f) controlling the IC temperature to be in the range between 100 and 450° C.

8. A method as in claim 1 including the further step, following step d), of:

g) while maintaining the atmosphere established in step b), depositing a second metal level overlying the first metal level surface to electrically interface to the first metal level, whereby the cleaning process facilitates a low resistance electrical connection.

9. A method as in claim 8 in which step g) includes depositing a second metal level selected from the group consisting of TiN, TiSi$_x$N$_y$, TaSi$_x$N$_y$, TaN, WN, WSi$_x$N$_y$, Ti, Ta, W, Cu, Al, Ag, and Au.

* * * * *